(12) United States Patent
Chikarmane et al.

(10) Patent No.: US 7,070,687 B2
(45) Date of Patent: Jul. 4, 2006

(54) APPARATUS AND METHOD OF SURFACE TREATMENT FOR ELECTROLYTIC AND ELECTROLESS PLATING OF METALS IN INTEGRATED CIRCUIT MANUFACTURING

(75) Inventors: Vinay B. Chikarmane, Portland, OR (US); Chi-Hwa Tsang, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 336 days.

(21) Appl. No.: 09/929,213

(22) Filed: Aug. 14, 2001

(65) Prior Publication Data

US 2003/0034251 A1 Feb. 20, 2003

(51) Int. Cl.
*C25D 5/02* (2006.01)

(52) U.S. Cl. ............... 205/123; 205/125; 205/205; 205/209; 205/210; 205/220; 205/224; 427/96; 427/97; 427/98; 427/237; 427/248.1; 427/255.23; 427/331; 427/372.2; 427/374.1; 427/404; 438/653; 438/654; 438/656; 438/660; 438/663; 438/672; 438/675; 738/677; 738/678; 738/686; 738/687

(58) Field of Classification Search ................ 205/123, 205/125, 205, 209, 210, 220, 224; 427/96, 427/97, 98, 237, 248.1, 255.23, 331, 372.2, 427/374.1, 404; 438/653, 654, 656, 660, 438/663, 672, 675, 677, 678, 686, 687
See application file for complete search history.

(56) References Cited

U.S. PATENT DOCUMENTS

| | | | |
|---|---|---|---|
| 5,891,513 A | 4/1999 | Dubin et al. | |
| 5,918,150 A | 6/1999 | Nguyen et al. | |
| 6,027,630 A * | 2/2000 | Cohen | ............ 205/135 |
| 6,037,258 A | 3/2000 | Liu et al. | |
| 6,048,445 A | 4/2000 | Brain | |
| 6,103,624 A | 8/2000 | Nogami et al. | |
| 6,147,404 A | 11/2000 | Pramanick et al. | |
| 6,159,857 A | 12/2000 | Liu et al. | |
| 6,169,024 B1 | 1/2001 | Hussein | |

(Continued)

FOREIGN PATENT DOCUMENTS

WO WO 99/63590 12/1999

(Continued)

OTHER PUBLICATIONS

U.S. Appl. No. PCT/US 02/22314, filed Dec. 7, 2002, International Search Report.

*Primary Examiner*—Arun S. Phasge
(74) *Attorney, Agent, or Firm*—Kathy J. Ortiz

(57) ABSTRACT

Apparatus and method for treating a surface of a substrate for electrolytic or electroless plating of metals in integrated circuit manufacturing. In one embodiment the method includes forming a barrier layer on a substrate. A metal-seed layer is then formed on the barrier layer. The method continues by performing in situ surface treatment of the metal-seed layer to form a passivation layer on the metal-seed layer. In another embodiment of a method of this invention, a substrate is provided into an electroplating tool chamber. The substrate has a barrier layer formed thereon, a metal seed layer formed on the barrier layer and a passivation layer formed over the metal seed layer. The method continues by annealing the substrate in forming gas to reduce the passivation layer. A conductive material is deposited on the substrate using an electrolytic plating or electroless plating process.

27 Claims, 5 Drawing Sheets

U.S. PATENT DOCUMENTS

| | | |
|---|---|---|
| 6,221,763 B1 | 4/2001 | Gilton et al. |
| 6,239,021 B1 | 5/2001 | Pramanick et al. |
| 6,242,349 B1 | 6/2001 | Nogami et al. |
| 6,319,728 B1 * | 11/2001 | Bhan et al. ................. 438/687 |
| 6,355,153 B1 * | 3/2002 | Uzoh et al. ................... 205/87 |
| 6,395,642 B1 | 5/2002 | Liu et al. |
| 6,423,200 B1 * | 7/2002 | Hymes ....................... 205/123 |
| 6,461,675 B1 * | 10/2002 | Paranjpe et al. ............ 427/250 |
| 6,498,397 B1 * | 12/2002 | Achuthan et al. ........... 257/758 |
| 6,554,914 B1 * | 4/2003 | Rozbicki et al. ............ 148/238 |
| 6,565,729 B1 * | 5/2003 | Chen et al. .................... 205/82 |
| 2002/0076929 A1 * | 6/2002 | Lu et al. ..................... 438/687 |

FOREIGN PATENT DOCUMENTS

WO    WO 01/24257 A1    4/2001

* cited by examiner

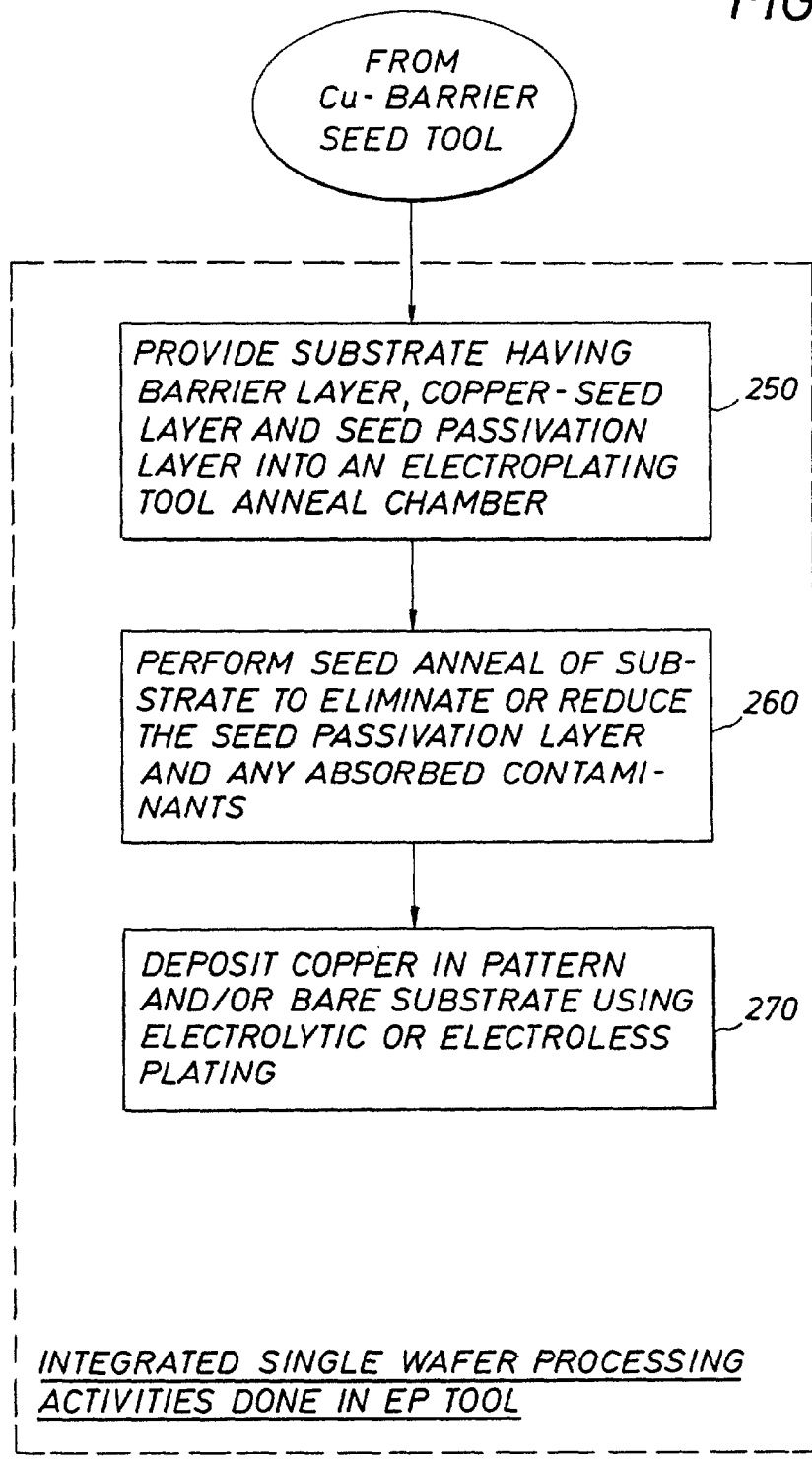

APPARATUS AND METHOD OF SURFACE TREATMENT FOR ELECTROLYTIC AND ELECTROLESS PLATING OF METALS IN INTEGRATED CIRCUIT MANUFACTURING

BACKGROUND OF THE INVENTION

1. Field of the Invention

The present invention relates to integrated circuit (IC) manufacture and more particularly to an apparatus and method of substrate surface treatment for electrolytic or electroless plating of metals or other conductive materials.

2. Description of Related Art

Modern integrated circuits use conductive interconnections to connect the individual devices on a chip or to send and receive signals external to the chip. Common types of interconnections include aluminum (Al) alloy interconnection lines and copper (Cu) interconnection lines coupled to individual devices, including other interconnection lines, by interconnections through vias. In order to enhance interconnect speed and reliability, the semiconductor manufacture industry is moving away from blanket deposition and etch of Al-based metallizations towards single damascene and dual damascene interconnect structures with Cu-based metallizations.

A damascene technique involves forming a via and an overlying trench in a dielectric to an underlying circuit device, such as a transistor or an interconnection line. The via and trench are then lined with a barrier layer of a refractory material. The barrier layer typically serves to inhibit the diffusion of the interconnection material that will subsequently be formed in the via into the dielectric. Next, a suitable seed material is deposited on the wall or walls and base of the via. Suitable seed materials for the deposition of copper interconnection material include copper and nickel. Following seed material deposition, the wafer may be cooled down in an atmosphere containing argon or nitrogen. Next, interconnection material, such as copper, is deposited in a sufficient amount to fill the via and trench using, for example, an electroplating process. Following the deposition of the interconnection material, a chemical-mechanical polishing or etching process is used to remove any interconnection material present outside the trench. If a trench and an underlying via are filled simultaneously with the interconnection metal, the process is known as a dual damascene process.

As IC design extends into submicron range, e.g. 0.18 microns and under, the reliability of copper and copper-based alloy interconnects becomes critical to a proper IC device operation. Conventional Cu-based metallization processes produce wafers that are saturated with pit defects, ultimately leading to less reliable IC devices.

BRIEF DESCRIPTION OF THE DRAWINGS

The present invention is illustrated by way of example and not limitation in the accompanying figures:

FIG. 2b is a process for performing integrated seed anneal and plating of a patterned and/or bare substrate surface following treatment process shown in FIG. 2a according to an embodiment of this invention.

DETAILED DESCRIPTION OF THE INVENTION

An apparatus and method to perform substrate surface treatment for electrolytic or electroless plating of metals or other conductive materials are described. The apparatus and method of this invention have significant advantages over current Cu-based metallization processes, including for example sharply reducing or eliminating post-electrolytic or electroless plating defects, improving wetting and promoting void-free electrolytic or electroless plating gap-fill in high aspect ratio vias and trenches, reducing IC processing cost by performing in-situ treatment of metal seed layer, and enhancing reliability.

In the following detailed description, numerous specific details are set forth, such as specific materials, structures, chemicals, processes, etc., in order to provide a more thorough understanding of the present invention. However, it will be apparent to those skilled in the art to which this invention pertains that the present invention may be practiced without these specific details. In other instances, well-known devices, methods, procedures, and individual components have not been described in detail so as not to unnecessarily obscure aspects of the present invention.

Figure 1A:
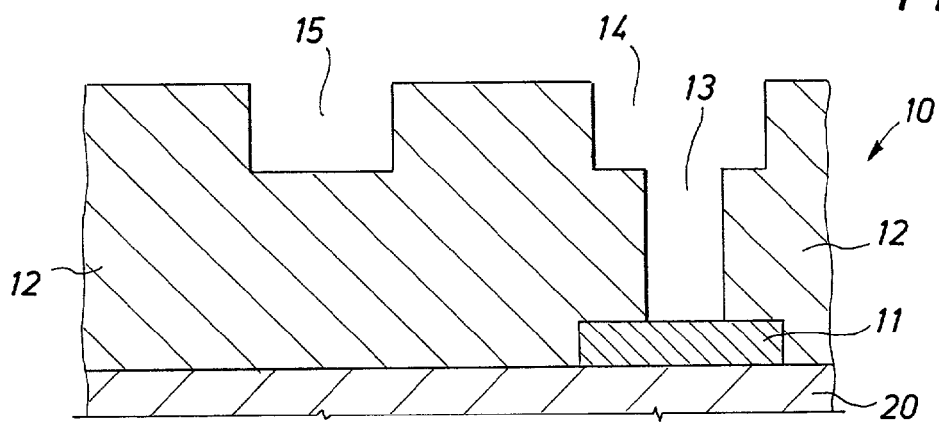
FIG. 1a is a cross-sectional view of an interconnect structure for a semiconductor device showing a formation of two trenches for laying wiring lines and in which one of the trenches has an underlying via opening for an interconnection to a lower metal layer, which is separated from the trench formation by an inter-layer dielectric (ILD) layer.
Figure 1B:
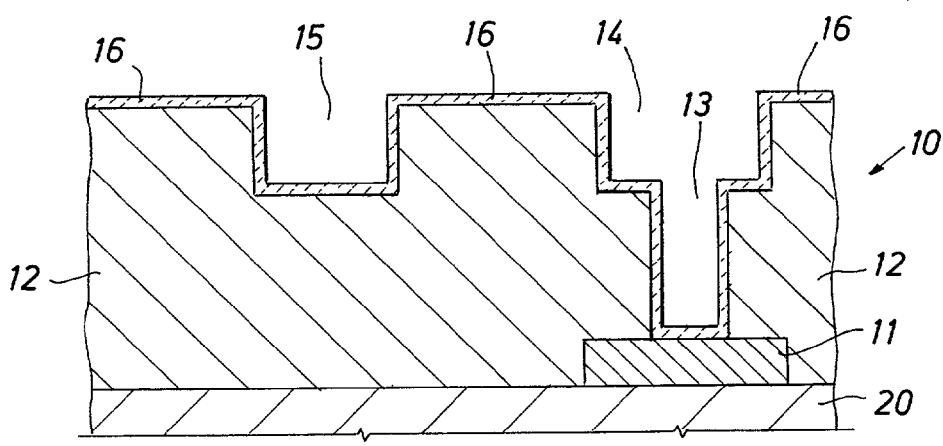
FIG. 1b is a cross-sectional view of the structure of FIG. 1a in which a barrier layer is formed over the ILD and in the trench openings and via opening.
Figure 1C:
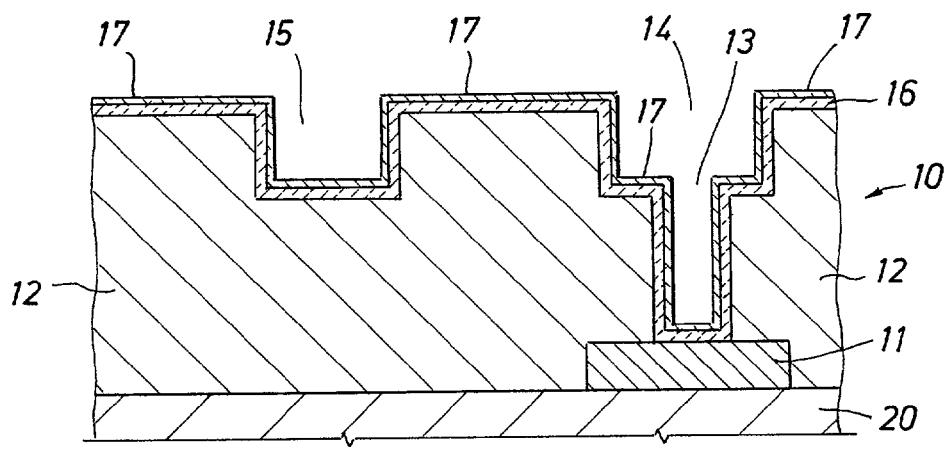
FIG. 1c is a cross-sectional view of the structure of FIG. 1b in which a metal seed layer, such as a Cu seed layer, is formed over the barrier layer formed over the ILD and in the trench openings and via opening.
Figure 1D:
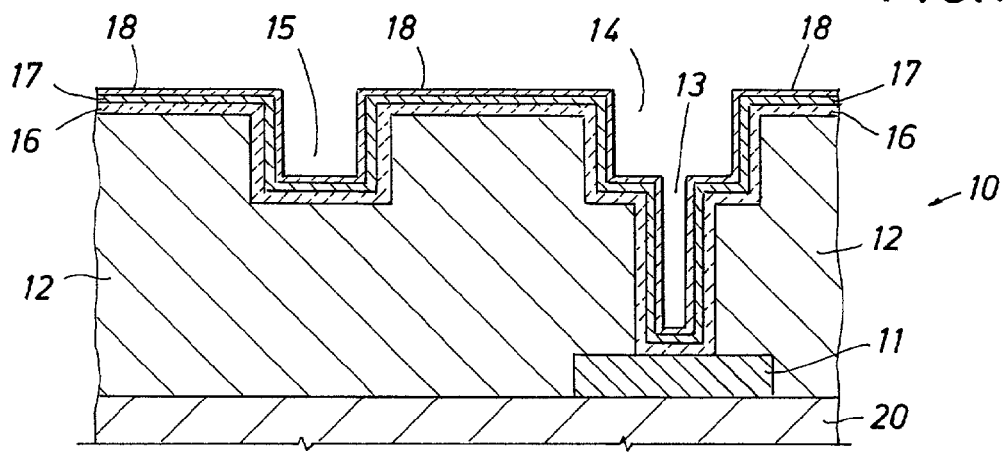
FIG. 1d is a cross-sectional view of the structure of FIG. 1c following an in-situ surface treatment of the structure in a barrier-seed tool deposition chamber to passivate a metal seed layer surface.
Figure 1E:
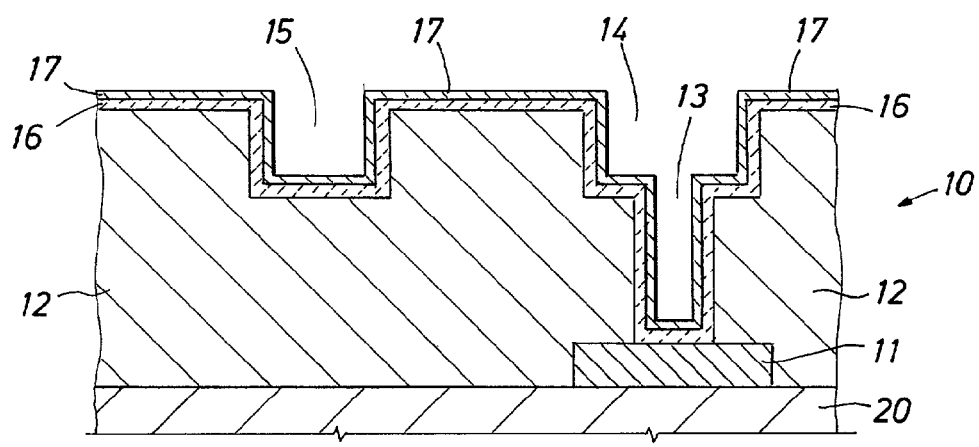
FIG. 1e is a cross-sectional view of the structure of FIG. 1d following a seed anneal of the structure in an anneal chamber attached to an electroplating tool to remove any contaminants formed over the metal seed layer.
Figure 1F:
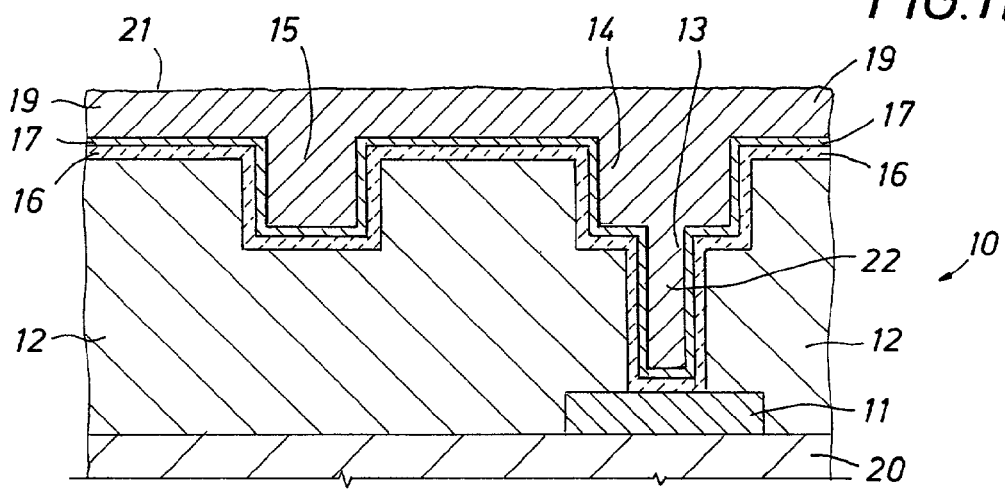
FIG. 1f is a cross-sectional view of the structure of FIG. 1e following electroless or electrolytic deposition of a metal or other conductive material over the annealed metal seed layer.
Figure 1G:
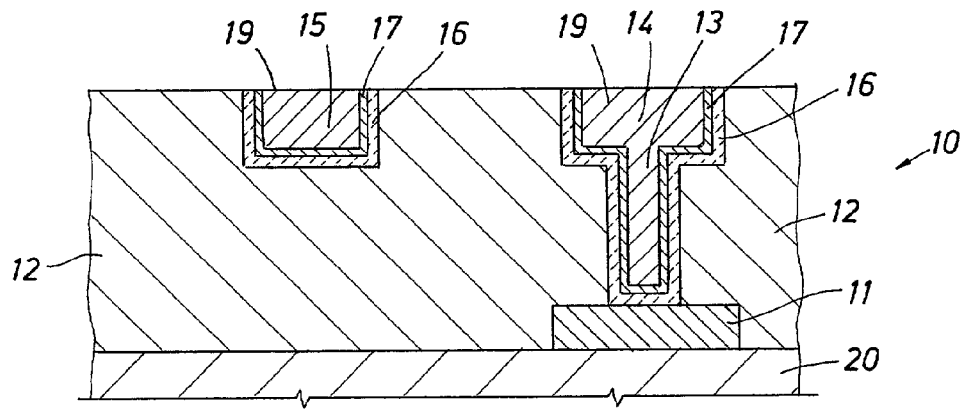
FIG. 1g is a cross-sectional view of the structure of FIG. 1f in which the excess metal, e.g. copper, electrolessly or electrolytically deposited above the ILD is removed.
Figure 2A:
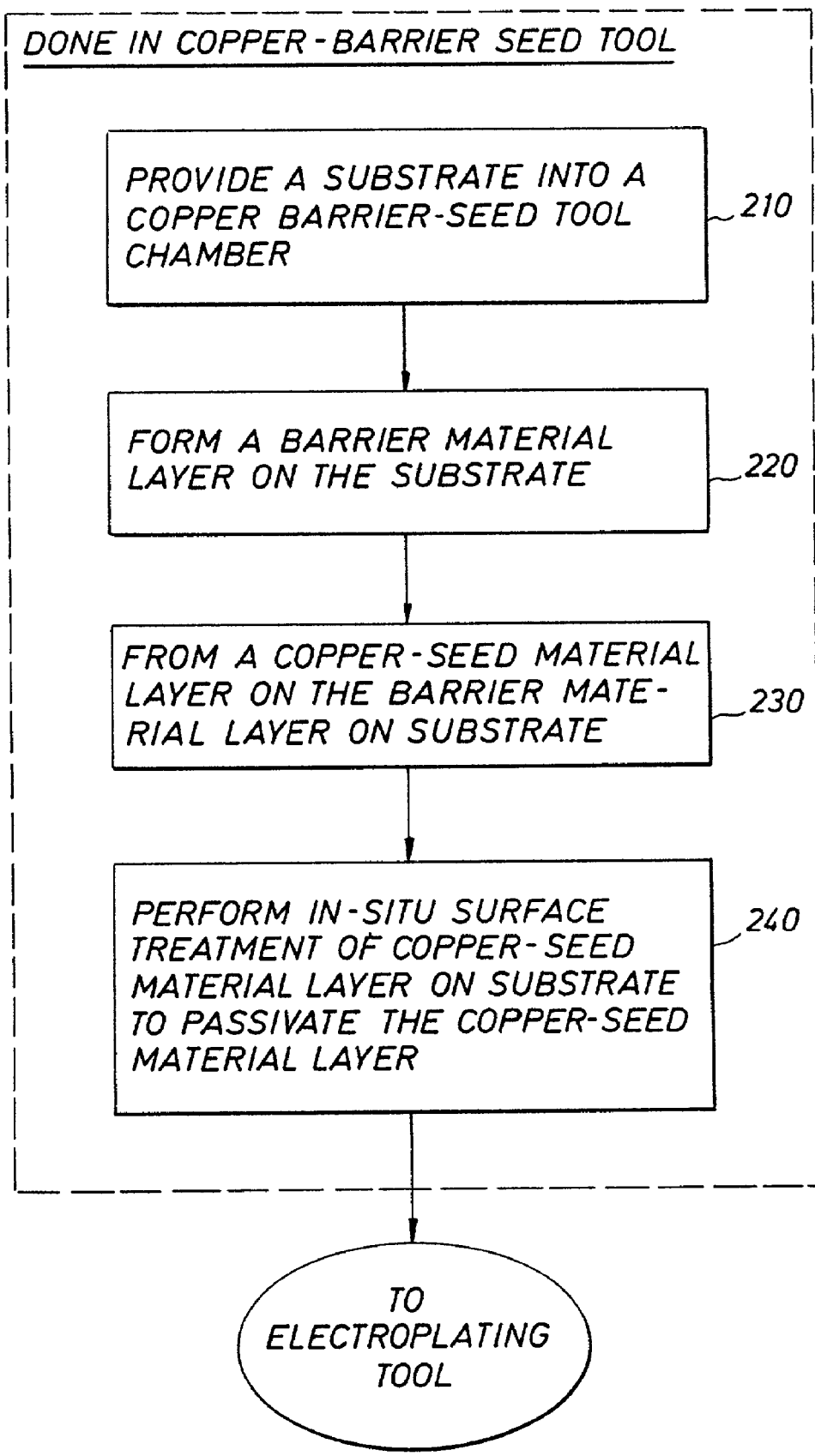
FIG. 2a is a process for treating a patterned and/or bare substrate surface following deposition of a metal seed layer according to an embodiment of this invention.

Referring now to the drawings, where like elements are designated by like reference numerals, embodiments of the present invention for substrate surface treatment for electrolytic or electroless plating of metals or other conductive materials used to manufacture an integrated circuit having a metal interconnect are illustrated by FIGS. 1a through 1g and by FIGS. 2a and 2b. FIGS. 1a–1g are schematic cross-section representations of the semiconductor structure at various phase during the manufacture process embodiments shown in FIGS. 2a and 2b. FIG. 2a, which is associated with FIGS. 1a–1d, shows an embodiment of a process of this invention for treating a patterned and/or bare substrate surface following deposition of a metal seed layer such that a protective passivation layer, for example a metal seed oxide layer or a metal seed nitride layer, is formed over the metal seed layer. FIG. 2b, which is associated with FIGS. 1e–1g, shows an embodiment of a process of this invention for performing integrated seed anneal and plating of a patterned and/or bare substrate surface following treatment process shown in FIG. 2a.

In Situ Surface Treatment

FIG. 1a shows an exemplary semiconductor substrate structure 10 having a metal layer 11 on a silicon substrate 20 and covered by an ILD layer 12. Metal layer 11 is representative of one of the metal layers in a multiple metal level semiconductor device. Layer 12 is typical of an ILD layer that is used to separate the different metal layers. ILD layer 12, which may be made of a material such as borophosphosilicate glass (BPSG), phosphosilicate glass (PSG), borosilicate glass (BSG), silicon dioxide, fluorine doped oxide, low k dielectric material, or spin-on dielectric material may be formed over the structure 10 by chemical vapor deposition (CVD), physical vapor deposition (PVD) or other suitable means.

It is understood that structure 10 is only a portion of many structures present on a semiconductor wafer. Trenches 14 and 15 are formed in structure 10 along with the formation of via opening 13 under trench 14 for interconnection to the lower metal layer 11. Structure 10 or similar can be fabricated utilizing single or dual damascene processes known in the art.

With reference to FIGS. 1a and 2a, process begins by providing a substrate structure 10 into a semiconductor device processing first tool 310 (shown in FIG. 3a), such as a copper-barrier seed deposition tool 310 (block 210 in FIG. 2a) to form a barrier layer on the substrate structure. As discussed in detail later, the copper-barrier seed deposition tool generally includes several chambers where substrate processing is performed without breaking vacuum. The surface of substrate structure 10 may be bare, for example substrate structure 10 may include only substrate 20. In another embodiment, substrate structure 10 may include a substrate 20 having a metal layer 11 and/or at least a trench 14, 15 and a via 13 patterned on an ILD layer 12. Other configurations or arrangements for substrate structure 10 are within the scope of this invention.

With reference to FIGS. 1b and 2a, in one embodiment, a barrier layer 16 is formed over the ILD layer 12 and in the trench openings 14, 15 and via opening 13 so that the barrier layer 16 overlies the ILD layer 12 and lines the inside of the trenches 14, 15 and via 13 (block 220 of FIG. 2a). Barrier layers, such as barrier layer 16, are typically used with metal interconnect material to optimize performance of the interconnects and to prevent diffusion of the metal interconnect material into the substrate.

Barrier layer 16 may be formed of tantalum (Ta), tantalum nitride (TaN), titanium (Ti), titanium nitride (TiN), tungsten nitride (WN), tungsten-tantalum (WTa), tantalum silicon nitride, or other ternary compounds. However, it is appreciated that other materials can be used for barrier layer 16 in the practice of the present invention. The barrier layer 16 is formed using known film deposition techniques, such as CVD, PVD, electrolytic plating or electroless plating. If the barrier layer 16 is TiN, then CVD or PVD can be used for the deposition of TiN. If the barrier layer 16 is Ta, then PVD can be used for the conformal deposition of Ta. A common practice for performing PVD is by sputtering. Generally, barrier layer 16 is deposited to a thickness in the range of approximately 150–300 angstroms (Å), however, other barrier thickness may be practiced within the scope of this invention. In an embodiment, barrier layer 16 is deposited to a thickness of about 200 Å.

With reference to FIGS. 1c and 2a, the process continues by forming a metal seed layer 17, such as a copper-seed layer 17, over the barrier layer 16 that overlies the ILD layer 12 and lines the inside of the trenches 14, 15 and via 13 (block 230 of FIG. 2a). Metal seed layer 17 can be deposited or formed using metals, metal alloys, metal compounds, multiple layers of metal stack or any substrates where a metal that is to be used to form the interconnects in the trench and the via can nucleate and grow. Generally, the metal seed layer 17 is made of a metal or metal alloy and may include, but is not limited to, copper, copper alloy, nickel, silver, gold, and cobalt.

The metal seed layer 17 is deposited/formed while the substrate structure 10 is still in the first semiconductor device processing tool 310, e.g., copper barrier-seed deposition tool 310 (shown in FIG. 3a), utilizing a directional deposition technique. Directional deposition techniques, which are known in the art, include collimated sputtering, plasma enhanced chemical vapor deposition, and ionized physical vapor deposition with or without bias voltage. Generally, seed layer 17 is deposited to a thickness in the range of approximately 1000–3000 angstroms (Å). In an embodiment, seed layer 17 is deposited to a thickness of about 2000 Å.

With reference to FIGS. 1d and 2a, the process continues by physically or chemically treating the metal seed layer prior to electrolytic/electroless plating of conductive material on substrate. Generally, the physical and/or chemical treatment of metal seed layer 17 may be done in-situ or ex-situ using a liquid or a chemically active or inert gas prior to electrolytic/electroless plating of the conductive material. For example, in one embodiment, the metal seed layer surface 17 may be exposed to gases, such as argon (Ar), Helium (He), Oxygen ($O_2$), Hydrogen ($H_2$), $H_2$ and He, $H_2$ and nitrogen ($N_2$), $H_2$ and Ar, etc. at a range of temperatures and concentrations known in the art. In another embodiment, the metal seed layer surface 17 is exposed to liquid media such as acids, bases, solvents, and di-ionized water prior to electrolytic/electroless plating of the conductive material in trenches 14, 15 and via 13 of substrate structure 10.

In one embodiment of this invention, treatment of metal seed layer 17 is done by performing in situ seed surface passivation (or metal seed layer treatment) of the substrate structure 10 having the metal seed layer 17 and the barrier layer 16 thereon to form a seed passivation layer 18, for example a metal oxide layer 18, on the metal seed layer 17 (block 240 in FIG. 2a). The in situ seed surface passivation (or seed treatment) is performed while the substrate structure 10 is still within a chamber of the metal barrier-seed deposition tool 310 (shown in FIG. 3a). To perform in situ seed surface passivation (or seed treatment) according to one embodiment of this invention, the chamber of the first substrate processing tool, e.g. copper-barrier seed deposition tool, having substrate structure 10 therewith is filled with a gas for a first specified period of time, $t_1$. The gas environment may include, but is not limited to, inert gases, hydrogen gas, fluorine containing gas, forming gas, oxygen gas, nitrogen gas, etc. The substrate structure 10 having the metal seed layer 17 and the barrier layer 16 thereon is then cooled in the gas (e.g. oxygen) environment in the sub-atmospheric chamber at a specified temperature, T, for a second specified period of time, $t_2$, to form a passivation layer 18, e.g. metal oxide layer 18, over the metal seed layer 17. Generally, a passivation layer 18 having a thickness in the range of approximately 5–100 angstroms (Å) may be formed over the metal seed layer 17.

According to an embodiment of this invention, the sub-atmospheric chamber of the copper-barrier seed deposition tool is filled with pure oxygen gas flowing at a pressure of up to about 2 torr for a first specified period of time $t_1$ of about 15–25 seconds, and preferably about 20 seconds. The substrate structure 10 having the metal seed layer 17 and the barrier layer 16 thereon is then cooled in the pure oxygen environment flowing into the sub-atmospheric chamber at a pressure of about 2 torr and a specified temperature T in a range of approximately 15–20° C. for a second specified period of time $t_2$ of about 5–15 seconds and preferably about 10 seconds. Generally, under the above conditions, a metal oxide layer 18, e.g. copper oxide layer 18, is formed to a thickness in the range of approximately 5–100 angstroms (Å). Those skilled in the art will recognize that characteristics/parameters for the process recipe, e.g. first specified period of time, $t_1$, second specified period of time, $t_2$, temperature, T, pressure in the copper-barrier seed deposition tool chamber, etc., may be modified according to the type of metal seed layer material used, type of gas introduced in the chamber, equipment specifications, manufacturing preferences, and other considerations.

Following in situ treatment of substrate surface in the copper barrier seed deposition tool, the substrate/wafer with is exposed to air while awaiting processing on the electroplating tool.

It will be noted that when copper is used to form a metal seed layer on the barrier layer 16, and oxygen is used as the gas in the chamber, in situ seed passivation (or seed surface treatment) of the Cu-seed layer 17 forms a layer of cupric oxide ($CuO_2$). Since the $CuO_2$ layer is formed, e.g. grown, inside a high vacuum chamber in the barrier-seed deposition tool, no contamination is trapped underneath this $CuO_2$ layer 18. When the substrate structure 10 is removed from the metal-barrier seed deposition tool and is exposed to atmosphere conditions, contamination (which may include an additional layer of $CuO_2$) will typically deposit on top of the $CuO_2$ layer 18 formed under vacuum conditions. Therefore, the $CuO_2$ layer 18 formed under vacuum conditions acts as a protective cover layer for the substrate structure 10 and its metal seed layer 17.

Integrated Seed Anneal—Electroless/Electrolytic Plating

Turning now to FIGS. 1e–1g and 2b, an embodiment of the process of this invention for performing integrated seed anneal and plating of a patterned and/or substrate surface following substrate surface treatment process shown in FIG. 2a is illustrated. The process is integrated since the tasks described in the following paragraphs (and shown in blocks 250–270 of FIG. 2b) are performed in the same processing tool 320, e.g. the electroplating tool 320 (shown in FIG. 3b).

With reference to FIGS. 1e and 2b, following in situ (or ex situ) seed surface passivation (or seed treatment) of the metal seed layer, for example in situ surface passivation of Cu-based seed layer in the Cu barrier-seed deposition tool, the substrate structure/wafer 10 having the barrier layer 16, metal seed layer 17, e.g. Cu-seed layer 17, and metal seed passivation layer 18, e.g. Cu-seed oxide layer 18 ($CuO_2$) formed in trenches 14, 15 and via 13 of structure ILD 12, is provided into a contamination removal chamber 322, e.g. an anneal chamber 322 (shown in FIG. 3b) of second semiconductor device processing tool 320, e.g. electroplating tool 320 (block 250 of FIG. 2b). While in the contamination removal or anneal chamber of electroplating tool, the substrate structure 10 is annealed in a forming gas to eliminate or reduce the seed passivation layer 18, e.g. metal seed oxide layer 18, as well as to eliminate or reduce any contaminants on the substrate (block 260 of FIG. 2b).

Generally, the metal seed anneal process includes flowing a forming gas or other gas mixtures into the contamination removal or anneal chamber of the electroplating tool for a third specified period of time $t_3$ at a specified seed anneal temperature $T_{seed\ anneal}$. In one embodiment of this invention, the forming gas used in the seed anneal process comprises 95% nitrogen gas ($N_2$) and 5% hydrogen ($H_2$) flowing into the seed anneal chamber at a specified seed anneal temperature $T_{seed\ anneal}$ of about 250° C. for a third specified period of time $t_3$ of about 30 seconds. In one embodiment, $N_2$ is provided into the anneal chamber at a flow rate of about 19 standard liters per minute (slm), while $H_2$ is provided into the anneal chamber at a flow rate of about 1 slm.

The seed anneal process (block 260 in FIG. 3b) further includes cooling the annealed substrate structure 10 in the forming gas or other gas mixtures for a fourth specified period of time $t_4$ at a seed anneal cooling temperature $T_{seed\ anneal\ cooling}$. In one embodiment of this invention, cooling the substrate structure in the forming gas of 95% $N_2$ and 5% $H_2$ includes flowing the forming gas into the seed anneal chamber at a seed anneal cooling temperature $T_{seed\ anneal\ cooling}$ of about 15–20° C. for a fourth specified period of time $t_4$ of about 25 seconds. $N_2$ is generally provided into the anneal chamber at a flow rate of about 19 slm, while $H_2$ is injected into the anneal chamber at a rate of about 1 slm.

With reference to FIGS. 1f and 2b, following the metal seed anneal procedure, the integrated seed anneal/electroplating process continues by performing electroless or electrolytic plating of substrate structure 10 to deposit a conductive material 19, e.g. metal or alloy, into trenches 14, 15, via 13 and overburden 21 of the substrate structure 10 (block 270 in FIG. 2b). The deposited conductive material will form a metal interconnect 22 for interconnection to the lower metal layer 11.

Electroless and electrolytic plating processes that may be used to form metal interconnect 22 are known in the art. Electrolytic plating includes deposition of metal from an electrolyte solution by cathodic reduction according to the general principle below:

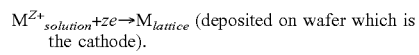
$M^{Z+}_{solution} + ze \rightarrow M_{lattice}$ (deposited on wafer which is the cathode).

Generally, the substrate/wafer is the negative terminal (cathode) on which metal deposition takes place. Electrons at the cathode are supplied by an external power supply.

Electroless plating includes deposition of metal from the electrolyte by chemical reduction. The reducing agent (e.g. Red) in the electrolyte is the source of the electrons. The substrate/wafer is the catalytic surface on which metal deposition takes place according to the general principle below:

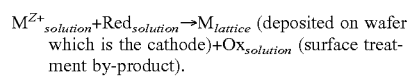
$M^{Z+}_{solution} + Red_{solution} \rightarrow M_{lattice}$ (deposited on wafer which is the cathode)+$Ox_{solution}$ (surface treatment by-product).

In an embodiment of this invention, depositing a conductive material into trenches 14, 15, via 13 and overburden 21 of the substrate structure 10 to form a metal interconnect may be done utilizing an electroplating or an electroless plating technique. The plating may be done with a solution of copper sulfate (resulting in a copper plating), silver nitrate (resulting in a silver plating) or gold cyanide (resulting in a gold plating). By way of example, in a conventional copper electroplating process, metallic ions in a pH neutral copper-based solution, such as a copper sulfate-based solution, may be reduced to a metallic state by applying current between seed material layer 17 and an anode of an electroplating cell in the presence of the solution. Copper metal becomes deposited onto seed material layer 17 to fill trenches 14, 15 and via 13 and form copper interconnection line 22.

By way of example, in an electroless copper plating process, the substrate structure/wafer 10 is exposed to a first plating solution by means such as immersion of the substrate structure/wafer 10 into a plating bath, or by spraying the plating solution onto the structure/wafer 10. The first plating solution is an aqueous solution of an acid such as hydrofluoric acid or sulfuric acid, and a metal salt or complex that is soluble in the acid used. A redox reaction occurs between the metal ions in the solution, e.g., cupric ions ($Cu^{2+}$) and a reducing agent leading to reduction of the metal ions and subsequent plating onto the copper seed layer 17. The reaction typically proceeds at room temperature for a period of time until the conductive interconnect/level is formed. Time and temperature may be adjusted as necessary to affect the rate of the reaction, and is known in the art.

With reference to FIGS. 1g and 2b, as an optional task, following electroless or electrolytic plating of substrate structure 10, a chemical-mechanical polishing (CMP) process or a chemical etch removal process may be performed. CMP or chemical etch removal polishes away or removes the excess copper material 19 and the barrier layer 17 above the ILD layer 12, so that the only copper and barrier layer material left will be in trenches 14, 15 and via 13 (as shown in FIG. 1g).

Figure 3A:
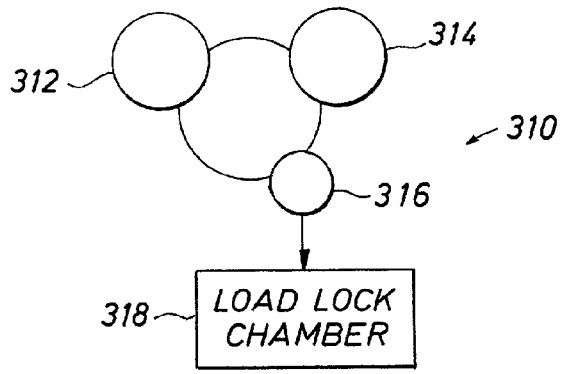
FIG. 3a schematically illustrates an exemplary embodiment of an apparatus for in situ substrate surface treatment according to this invention.
Figure 3B:
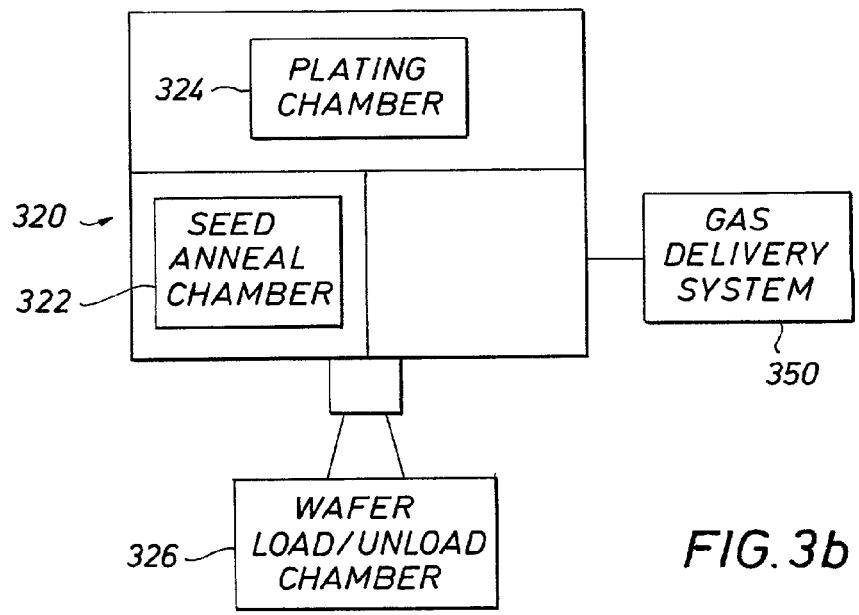
FIG. 3b schematically illustrates an exemplary embodiment of an apparatus for integrated seed anneal/electrolytic or electroless plating of metals or other conductive materials according to this invention.

Turning to FIGS. 3a and 3b, exemplary embodiments of systems for performing in situ or ex situ seed surface treatment (system 310 in FIG. 3a) and for performing integrated seed anneal and electrolytic or electroless plating of metals or other conductive materials (system 320 in FIG. 3b) according to this invention are schematically illustrated.

With reference to FIG. 3a, generally, system 310 is a metal barrier seed deposition tool 310, for example a copper-barrier seed deposition tool 310. The copper-barrier seed deposition tool 310 may have various configurations and arrangements, depending on the substrate manufacture process used, manufacturing preferences, etc. In an exemplary embodiment, the copper-barrier seed deposition tool 310 includes a plurality of chambers 312, 314, 316, 318 that may be used for various phases of the process illustrated in FIG. 2a. For example, chamber 312 of copper-barrier seed deposition tool 310 may be used as barrier layer deposition chamber, while vacuum chamber 314 may be used as a metal seed layer, e.g. Cu seed layer deposition chamber. Chamber 316 may be a cooldown chamber in the CBS tool 310, and may be used to perform in situ surface treatment of the seed layer to form a passivation layer, e.g., a metal seed oxide layer, under vacuum conditions. Chamber 318 may function as a load lock chamber for the copper barrier seed deposition tool 310.

With reference to FIG. 3b, generally, system 320 is an electroplating tool 320. The electroplating tool 320 also may have various configurations and arrangements, depending on the substrate manufacture process used, manufacturing preferences, etc. In an exemplary embodiment, the electroplating tool 320 includes a plurality of chambers 322, 324, 326 that may be used for various phases of the process illustrated in FIG. 2b. For example, chamber 322 of electroplating tool 320 may be a contamination removal chamber, e.g. seed anneal chamber, used to reduce or eliminate the seed passivation layer, e.g. metal seed oxide layer, formed in chamber 316 of the copper barrier seed deposition tool 310. A gas delivery system 350 may be coupled to the electroplating tool 320 to introduce a forming gas into the chamber 322 to remove or reduce the seed passivation layer and any absorbed contaminants. Chamber 324 may be an exemplary plating chamber while chamber 326 may be used as load/unload wafer cassettes chamber. As mentioned above, the arrangement of electroplating tool 320 allows performing an integrated metal seed anneal/electroplating process of individual wafers/substrates.

Thus, a method and apparatus for substrate surface treatment for electrolytic or electroless plating of metals or other conductive materials have been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

We claim:

1. A method comprising:
   providing a substrate into a processing tool;
   forming a barrier layer on the substrate;
   forming a metal seed layer over the barrier layer;
   forming a passivation layer over the metal seed layer while in the processing tool by exposing the substrate having the metal seed layer and the barrier layer to a gas for a first specified period of time, and cooling the gas at a specified temperature for a second specified period of time;
   providing the substrate with the barrier layer, metal seed layer and the passivation layer into a contamination removal chamber of a plating tool;
   annealing the substrate within the plating tool; and
   depositing a conductive material at least in a trench and a via patterned on the substrate structure within the plating tool.

2. The method of claim 1 wherein forming the passivation layer comprises forming a passivation layer in a gas environment selected from the group consisting of inert gases, hydrogen gas, fluorine containing gas, forming gas, oxygen gas and nitrogen gas.

3. The method of claim 1 wherein forming the passivation layer comprises forming a passivation layer using a liquid selected from the group consisting of acids, bases, solvents and di-ionized water.

4. The method of claim 2 wherein forming the passivation layer comprises forming a passivation layer in an oxygen gas environment to form a metal oxide layer on the metal seed layer.

5. The method of claim 1 wherein the metal seed layer is selected from the group consisting of copper, copper alloy, nickel, silver, gold and cobalt.

6. The method of claim 1 wherein the barrier layer is selected from the group consisting of tantalum, tantalum nitride, titanium, titanium nitride, tungsten nitride, tungsten-tantalum and tantalum silicon nitride.

7. The method of claim 1 wherein the processing tool is a metal-barrier deposition tool.

8. The method of claim 1 wherein the first specified period of time is in a range of approximately 15–25 seconds.

9. The method of claim 1 wherein the second specified period of time is in a range of approximately 5–15 seconds.

10. The method of claim 1 wherein the specified temperature is about 15–20° C.

11. The method of claim 1 wherein the gas comprises oxygen gas at a pressure of up to 2 torr.

12. The method of claim 1 further comprising annealing the substrate with the barrier layer, metal seed layer and the passivation layer in forming gas to remove the passivation layer.

13. The method of claim 12 wherein annealing comprises flowing forming gas into an anneal chamber for a first specified period of time at a seed anneal cooling temperature of about 250° C.

14. The method of claim 13 further comprising cooling the annealed substrate in forming gas for a second specified period of time at a seed anneal cooling temperature of about 15–20° C.

15. The method of claim 14 wherein the second specified period of time is about 25 seconds.

16. The method of claim 13 wherein the first specified period of time is about 30 seconds.

17. The method of claim 12 wherein the forming gas comprises about 95 percent nitrogen and 5 percent hydrogen.

18. The method of claim 12 further comprising depositing a conductive material at least in a trench and a via patterned on the substrate structure using electrolytic plating.

19. The method of claim 18 wherein the conductive material is selected from the group consisting of copper, silver and gold.

20. A method comprising:
providing a substrate into a plating tool, the substrate having at least a trench and at least a via patterned thereon, a barrier layer formed in the trench and the via, a metal seed layer formed on the barrier layer and a passivation layer formed on the metal seed layer, wherein the metal seed layer and the passivation layer are formed substantially sequentially within a same processing tool;
annealing the substrate in forming gas to remove the passivation layer; and
depositing a conductive material at least inside the trench and the via of the substrate using a plating process selected from the group consisting of electrolytic plating and electro less plating wherein the annealing and depositing are performed substantially sequentially for each substrate in a substrate batch under vacuum conditions within the plating tool.

21. The method of claim 20 wherein annealing comprises flowing forming gas into a contamination removal chamber of the plating tool for a first specified period of time at a seed anneal temperature of about 250° C.

22. The method of claim 21 further comprising cooling the annealed substrate in forming gas for a second specified period of time at a temperature of about 15–20° C.

23. The method of claim 22 wherein the second specified period of time is about 25 seconds.

24. The method of claim 21 wherein the first specified period of time is about 30 seconds.

25. A system comprising:
at least one seed anneal chamber to perform seed anneal of a substrate, the substrate having at least a trench and a via patterned thereon, a barrier layer formed in the trench and the via, a metal seed layer formed on the barrier layer, and a seed passivation layer formed on the metal seed layer, wherein the metal seed layer and the seed passivation layer are formed substantially sequentially within a same processing tool;
a gas delivery system coupled to the at least one seed anneal chamber to introduce a forming gas into the contamination removal chamber to remove the seed passivation layer; and
at least one plating chamber coupled to the at least one seed anneal chamber and to the gas delivery system, the at least one plating chamber for depositing a conductive material at least inside the trench and the via of the substrate using a plating process selected from the group consisting of electrolytic plating and electroless plating, wherein the seed anneal chamber and the plating chamber comprise a plating tool.

26. The system of claim 25 wherein performing seed anneal and depositing a conductive material are performed substantially sequentially for each substrate batch under vacuum conditions within the plating tool.

27. The system of claim 25 wherein the gas delivery system introduces into the seed anneal chamber hot forming gas at a temperature of about 250° C. for about 30 seconds followed by cool forming gas at a temperature of about 20° C. for about 25 seconds.

* * * * *